(12) United States Patent
Tsai et al.

(10) Patent No.: US 6,852,590 B1
(45) Date of Patent: Feb. 8, 2005

(54) DEEP TRENCH CAPACITOR AND METHOD OF FABRICATING THE SAME

(75) Inventors: Tzu-Ching Tsai, Taoyuan (TW); Shih-Chung Chou, Taoyuan (TW)

(73) Assignee: Nanya Technology Corporation, Taoyuan (TW)

(*) Notice: Subject to any disclaimer, the term of this patent is extended or adjusted under 35 U.S.C. 154(b) by 0 days.

(21) Appl. No.: 10/709,926

(22) Filed: Jun. 7, 2004

Related U.S. Application Data

(62) Division of application No. 10/707,113, filed on Nov. 21, 2003.

(30) Foreign Application Priority Data

Sep. 5, 2003 (TW) .................................... 92124553 A

(51) Int. Cl.⁷ .......................................... H01L 21/8242
(52) U.S. Cl. ...................... 438/243; 438/249; 438/386; 438/389
(58) Field of Search ................................ 438/243, 244, 438/245, 247, 249, 386, 387, 389, 390, 392

(56) References Cited

U.S. PATENT DOCUMENTS 6,110,792 A * 8/2000 Bronner et al. ............. 438/386
6,281,069 B1 * 8/2001 Wu et al. .................... 438/248

* cited by examiner

Primary Examiner—Jack Chen
(74) Attorney, Agent, or Firm—Jiang Chyun IP Office

(57) ABSTRACT

A method of fabricating a deep trench capacitor is described. A substrate having a deep trench therein is provided. A doped region is formed in the substrate at the bottom of the deep trench, a dielectric layer is formed on the bottom surface of the deep trench, and a first conductive layer is formed on the dielectric layer. A collar oxide layer is formed on sidewalls of the deep trench that are not covered by the first conductive layer. A material layer is formed covering the first conductive layer and exposing a portion of the collar oxide layer. The exposed collar oxide layer is removed to expose the substrate. Then, the material layer is removed, and a second conductive layer is formed in the deep trench covering the first conductive layer and the collar oxide layer. In this invention, only the second conductive layer is formed on the first conductive layer for electrically connecting the capacitor and an active device, hence the method is more simple.

11 Claims, 8 Drawing Sheets

DEEP TRENCH CAPACITOR AND METHOD OF FABRICATING THE SAME

CROSS REFERENCE TO RELATED APPLICATIONS

This application is a divisional of a prior application Ser. No. 10/707,113, filed Nov. 21, 2003, which claims the priority benefit of Taiwan application serial no. 92124553, filed Sep. 5, 2003.

BACKGROUND OF INVENTION

1. Field of the Invention

The present invention is related to a capacitor of Dynamic Random Access Memory (DRAM) and a method of fabricating the same, and more particularly to a deep trench capacitor and a method of fabricating the same.

2. Description of the Related Art

As the semiconductor technology has advanced to the Deep Sub-Micron technology, the sizes of devices keep shrinking. As to the traditional structure of DRAM, the areas of capacitors have been reduced. In another aspect, software programs become large gradually, so the capacities of memories should also increase. Under the circumstance that sizes of memories should shrink and the capacities of memories should increase, the traditional method of fabricating capacitors of DRAM should be improved to satisfy the above demand.

The DRAM capacitor generally include stack capacitor and deep trench capacitor. Regardless of the type of capacitor, size reduction requirement of semiconductor devices and the technology of fabricating the small size capacitors is very complex.

FIGS. 1A–1F are a schematic cross-sectional process flow showing a prior art method of fabricating a deep trench capacitor.

Referring to FIG. 1A, first a substrate 100 is provided, and a mask layer 102 is formed over the substrate 100. Then, an etching process is performed for forming a deep trench 104 within the substrate 100. Then, a doped region 106 is formed within the substrate 100 at the bottom of the deep trench 104, which serves as an electrode of the deep trench capacitor. Next, a capacitor dielectric layer 108 is formed over the surface of the bottom of the deep trench 104. A first polysilicon layer 110 is formed within the deep trench 104 covering the capacitor dielectric layer 108, wherein the first polysilicon layer 110 serves as another electrode of the deep trench capacitor. A collar oxide layer 112 is then formed on the sidewalls of the deep trench 104 that are not covered by the first polysilicon layer 110.

Referring to FIG. 1B, a second polysilicon layer 114 is formed on the hard mask layer 102 covering the first polysilicon layer 110 and the collar oxide 112. A chemical mechanical polish process and an etching process are performed for removing a portion of the second polysilicon layer 114 and the remaining portion of the second polysilicon layer 114a is left in the deep trench 104 as shown in FIG. 1C.

Then, referring to FIG. 1D, a portion of the collar oxide layer 112 that is not covered by the second polysilicon layer 114a is removed and the remaining portion of the collar oxide layer 112a is left behind, wherein the substrate 100 at the sidewalls of the top of the deep trench is exposed.

Please referring to FIG. 1F, a third polysilicon layer 116 is formed on the mask layer 102, covering the second polysilicon layer 114a and the collar oxide layer 112a. A chemical mechanical polish process and an etching process are performed for removing a portion of the third polysilicon layer 116, and the remaining portion of the polysilicon layer 116a is left in the deep trench 104. As shown in FIG. 1F, the remaining portion of the third polysilicon layer 116a contacts the substrate 100 at the sidewalls of the top of the deep trench. Next, an active device (not shown) such as a transistor is formed on the substrate 100, and the electrode 110 of the deep trench capacitor can electrically connect to the transistor through the second polysilicon layer 114a and the third polysilicon layer 116a.

However, in prior art, in order to form the collar oxide layer 112a on the sidewalls of the deep trench 104 as shown in FIG. 1D and to expose the substrate 100 at the sidewalls of the top of the deep trench 104, the second polysilcon layer having different removal rate compared to the collar oxide 112 should be formed first, then a portion of the collar oxide is removed for exposing the substrate 100 at the sidewalls of the top of the deep trench. Because the second polysilicon layer 114a electrically connects with the first polysilicon layer 110 and the portion of the third polysilicon layer 116a is formed on the second polysilicon layer 114a, the deep trench capacitor electrically connects to an active device through the third polysilicon layer 116a and the second polysilicon layer 114a.

However, because the second polysilicon layer and the third polysilicon layer are formed in different process steps, dopant concentrations of the second polysilicon layer and the third polysilicon layer are therefore little different. Therefore, the difference will affect the threshold voltage of the devices.

Another issue is that resistance exists at the interface of the second polysilicon layer and the third polysilicon layer, and therefore the electrical component electrically connecting the deep trench capacitor and the active device will have a higher resistance.

SUMMARY OF INVENTION

One object of the present invention is to provide a deep trench capacitor and a method of fabricating the same for resolving the high resistance at the interface of the second polysilicon layer and the third polysilicon layer.

Another object of the present invention is to provide a deep trench capacitor and a method of fabricating the same for resolving the differential dopant concentrations of the second polysilicon layer and the third polysilicon layer, which would otherwise adversely affect the threshold voltage of the devices.

The present invention discloses a method of fabricating a deep trench capacitor. A substrate is provided. Next, a deep trench is formed within the substrate, and a doped region formed at the bottom of the deep trench. Next, a capacitor dielectric layer formed over a surface of the bottom of the deep trench and a first conductive layer is formed over the capacitor dielectric layer. Then, a collar oxide layer is formed on sidewalls of the deep trench that are not covered by the first conductive layer. A material layer is formed within the deep trench, covering the first conductive layer, and exposing a portion of the collar oxide layer, wherein the removal rate of the material layer is different from that of the collar oxide layer, and the removal rate of the material of the material layer is different form that of the first conductive layer. In a preferred embodiment, the material layer is a photoresist layer. The collar oxide layer that was exposed is then removed for exposing the substrate at sidewalls of the top of the deep trench. Then, a second conductive layer is formed covering the first conductive layer and the collar oxide layer, wherein the second conductive layer contacts the substrate at the sidewalls of the top of the deep trench.

The present invention provides a deep trench capacitor, comprising a substrate, a doped region, a capacitor dielectric layer, a first conductive layer, a collar oxide and a second conductive layer. The substrate has a deep trench, and the doped region is within the substrate at the bottom of the deep trench. The first conductive layer is on the capacitor dielectric layer. The collar oxide layer is on the sidewalls of the top of the deep trench, and the substrate at the sidewalls of the top of the deep trench is exposed. The second conductive layer is within the deep trench, covering the first conductive layer and the collar oxide layer, and the second conductive layer contacts the substrate at the sidewalls of the top of the substrate.

Because the second conductive layer replaces the prior art second and third conductive layers, the issue of the second conductive layer having a different dopant concentrations compared to the third conductive layer which would otherwise adversely affect the threshold voltage of devices is avoided.

In addition, the present invention uses the second conductive material as a component for electrically connecting the deep trench capacitor and the active device to resolve the issue of resistance at the interface of the second and third conductive layers existing in prior art.

Moreover, because the second conductive layer replaces the second and third conductive layers of the prior art, and therefore the method of the present invention can greatly simplify the process, in that, a number of the polysilicon furnaces can be reduced.

In order to make the aforementioned and other objects, features and advantages of the present invention understandable, a preferred embodiment accompanied with figures is described in detail hereinafter.

DETAILED DESCRIPTION

FIGS. 2A-2I are a schematic cross-sectional views illustrating the progression of process steps of a method of fabricating a deep trench capacitor according to a preferred embodiment of the present invention.

Figure 1A:
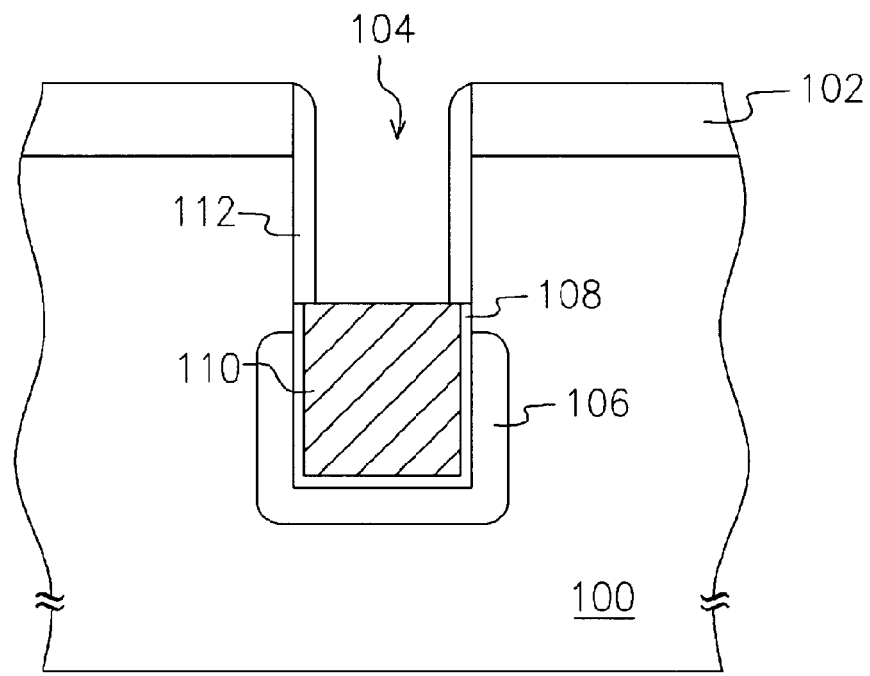
FIGS. 1A–1F are a schematic cross-sectional views illustrating the progression of process steps of a prior art method of fabricating a deep trench capacitor.
Figure 1B:
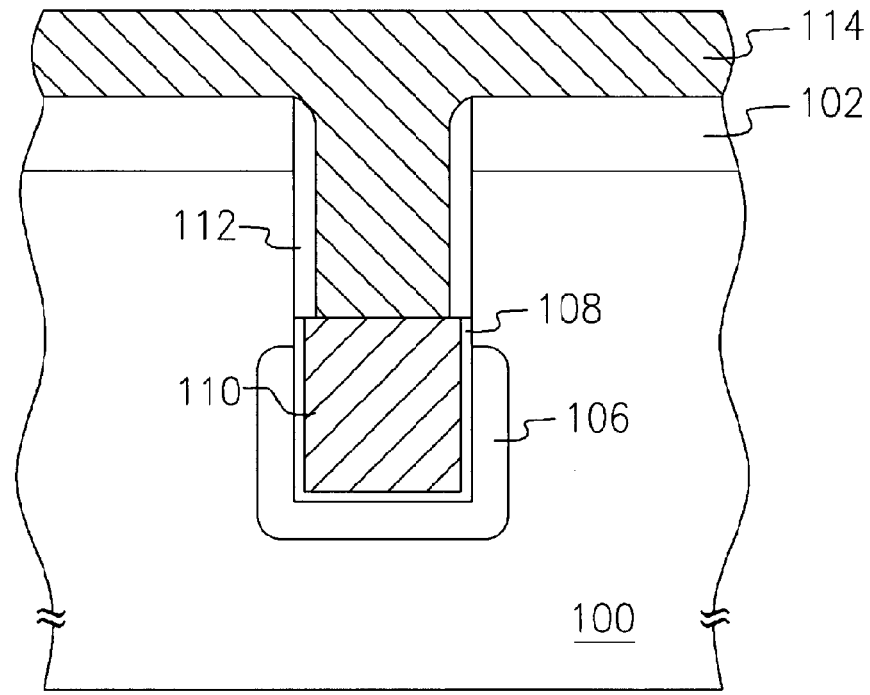
Figure 1C:
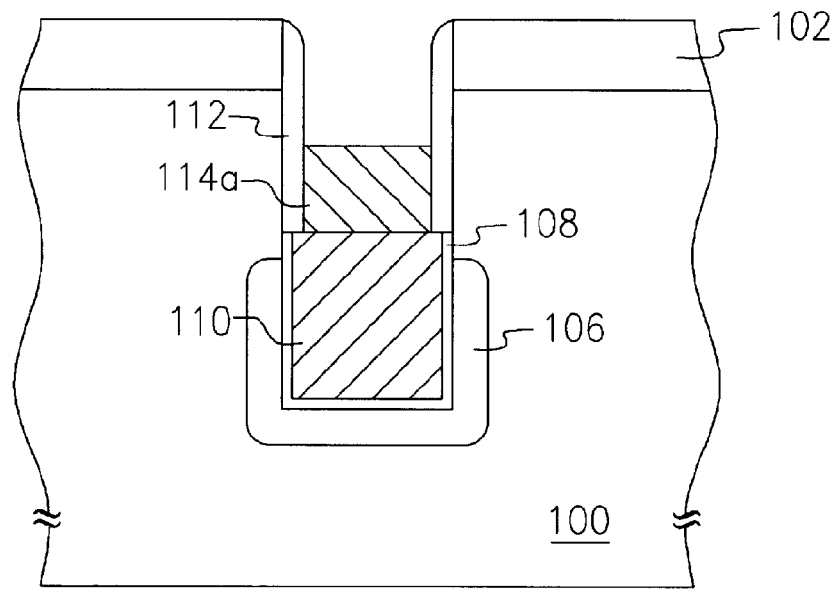
Figure 1D:
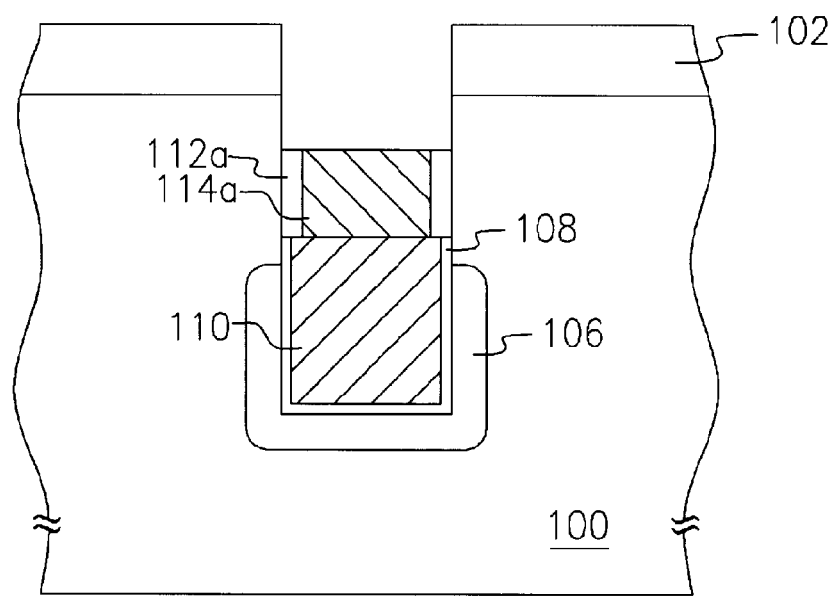
Figure 1E:
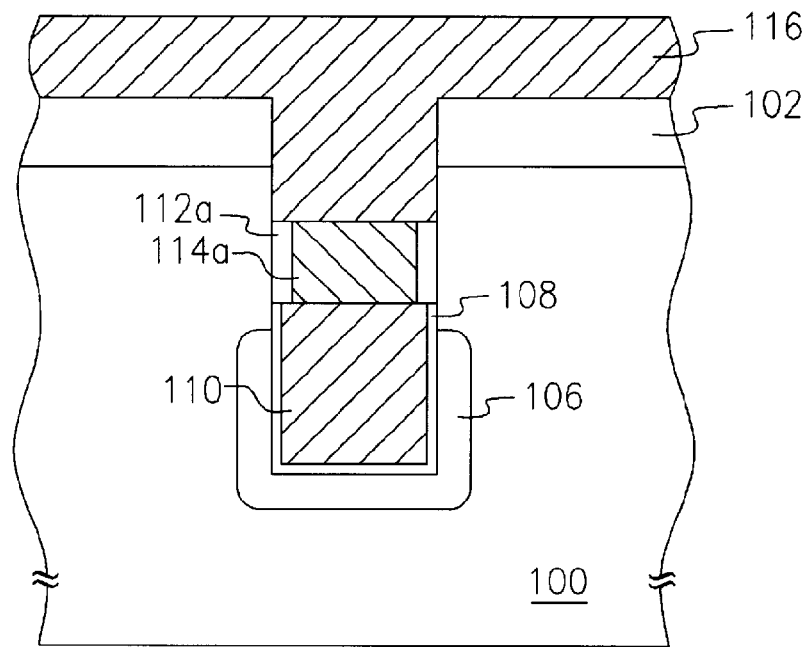
Figure 1F:
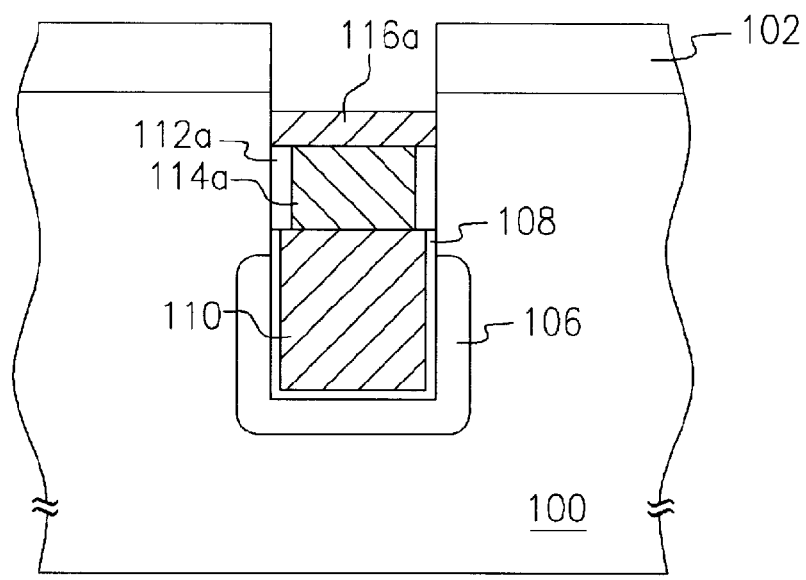
Figure 2A:
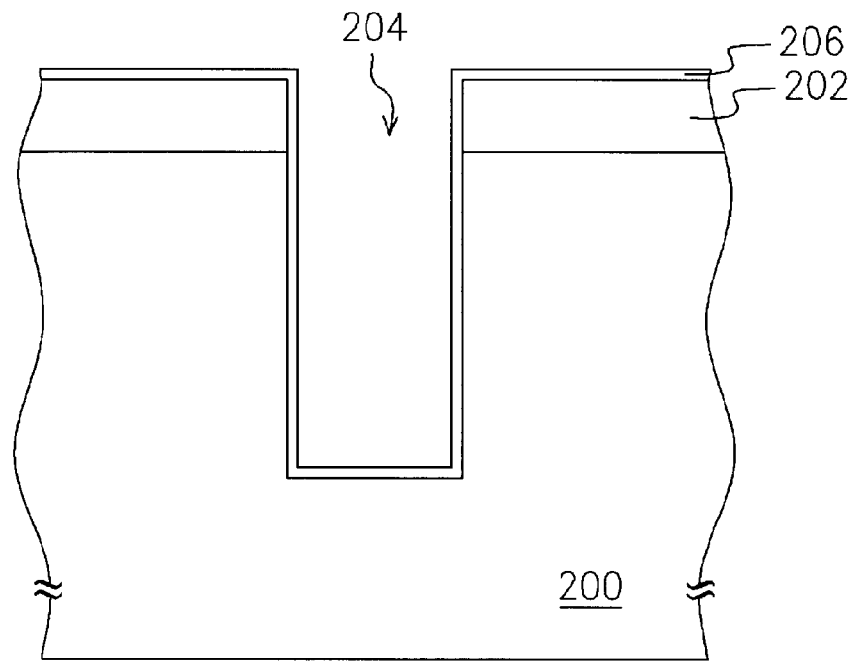
FIGS. 2A-2I are a schematic cross-sectional views illustrating the progression of process steps of a method of fabricating a deep trench capacitor according to a preferred embodiment of the present invention.

Referring to FIG. 2A, a substrate 200 is provided. Next, a mask layer 202 is formed on the substrate 200. In a preferred embodiment, the material of the mask layer 202 is, for example, silicon nitride. Then, an etching process is performed by using the mask 202 as an etching mask. A doped layer 206 is then formed on the surfaces of the mask layer 202 and the deep trench 204. In a preferred embodiment, the doped layer 206 is, for example, a silicon oxide layer doped with arsenic.

Figure 2B:
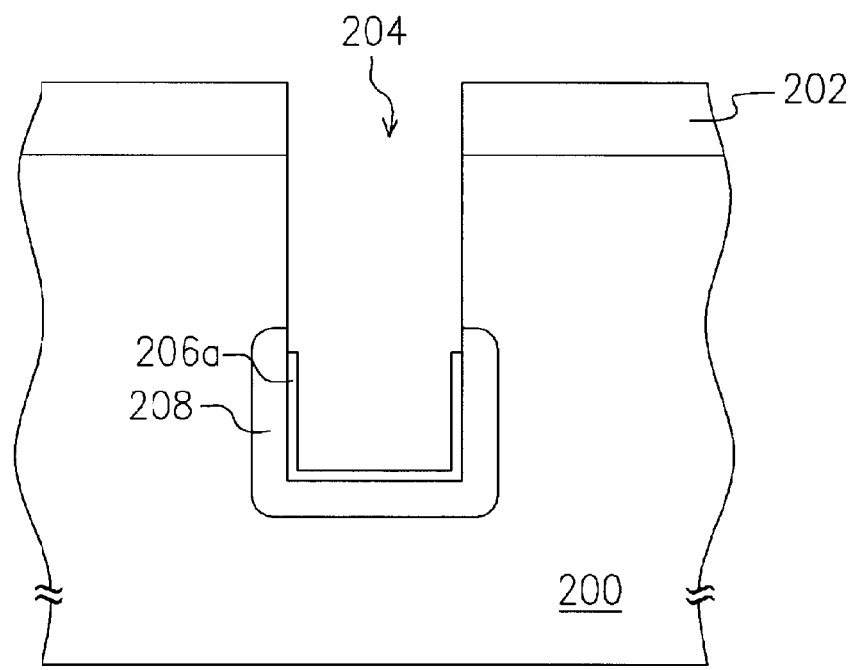

Then, a portion of doped layer 206 is removed and a remaining portion of doped layer 206a is left at the bottom of the deep trench 204 as shown in FIG. 2B. The methods of removing the portion of doped layer 206 and the remaining portion of the doped layer 206a at the bottom of the deep trench 204 comprise, for example, first forming a photoresist layer (not shown) in the deep trench, but not completely filling the deep trench 204. Then, an etching process is performed for removing a portion of the doped layer 206 that is not covered by the photoresist layer. Finally, the photoresist layer is removed; therefore, the doped layer 206a is formed at the bottom of the deep trench 204.

Then, a thermal process is performed for diffusing ions within the doped layer 206a into substrate 100 to form the doped region 208. The doped region 208 is a buried electrode that serves as one of the electrode of the deep trench capacitor.

Figure 2C:
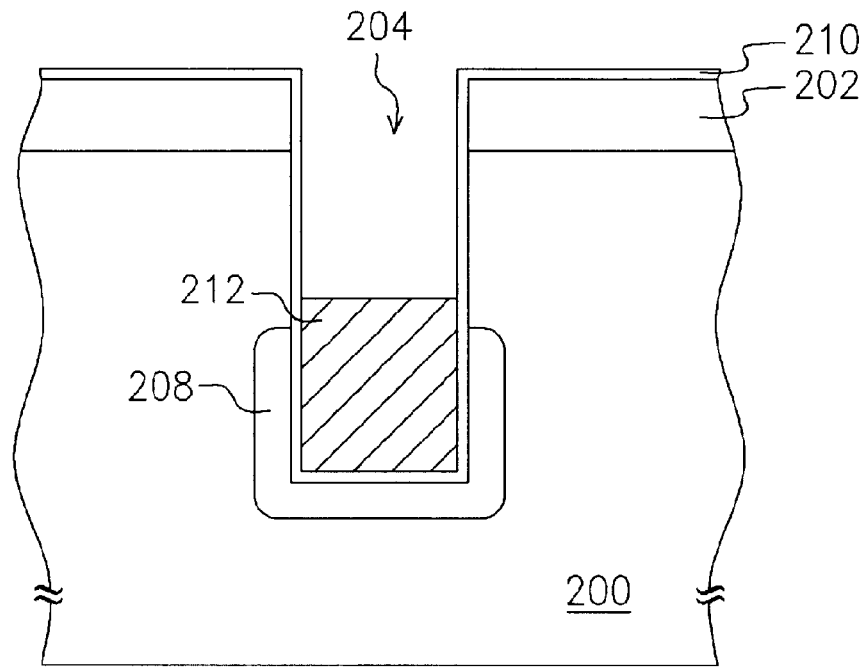

Referring to FIG. 2C, a dielectric layer 210 is formed on the surfaces of the mask layer 202 and the deep trench 204. Then, a first conductive layer 212 is filled in the deep trench 204 covering the dielectric layer 210, wherein the first conductive layer 212 does not completely fill the deep trench 204, and the first conductive layer 212 serves as another electrode of the deep trench capacitor. In a preferred embodiment, the material of the first conductive layer is, for example, polysilicon, and the method of forming the first conductive layer 212 comprises, for example, first forming a conductive layer (not shown) on the mask layer 202, and filling the deep trench 204. A chemical mechanical polish process is then performed for removing a portion of the conductive layer until the mask layer 202 is exposed. Then, an etching process is performed for removing another portion of the conductive layer in the deep trench.

Figure 2D:
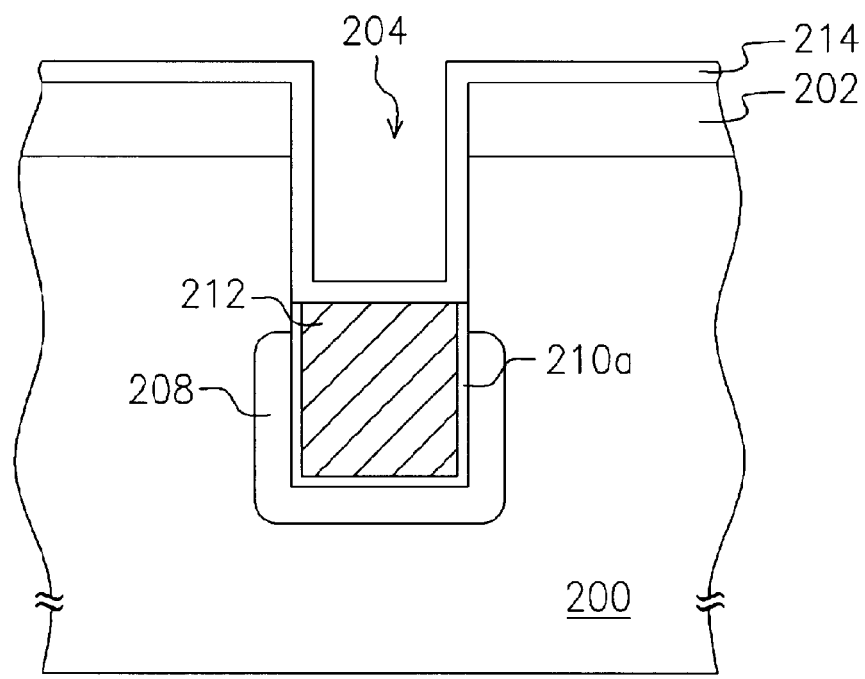

After forming the first conductive layer 212, the dielectric layer 210 that is not covered by the first conductive layer 212 is removed for forming the capacitor dielectric layer 210a as shown in FIG. 2D. Then, an oxide layer 214 is formed on the surface of the mask layer 202 and the surface of the deep trench 204 that is not covered by the first conductive layer 212.

Figure 2E:
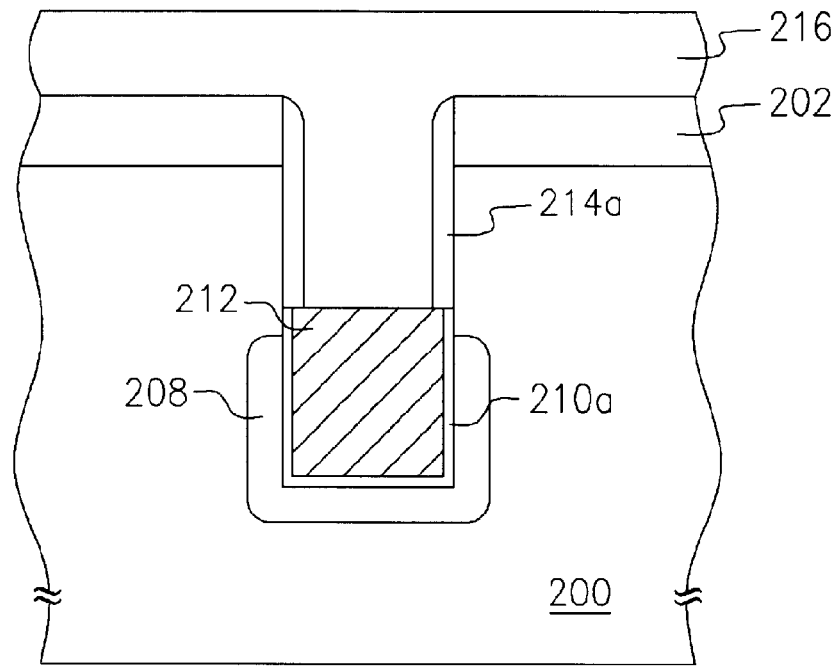

Then, please referring to FIG. 2E, the oxide layer 214 is etched and a collar oxide layer 214a on the sidewalls of the deep trench 204 is formed. A material layer 216 is then formed on the mask layer 202 and completely fills the deep trench 204.

In a preferred embodiment, the removal rate of the material layer 216 is different from that of the collar oxide layer 214a, and the material of the material layer 216 is different from that of the first conductive layer 212. For example, the material of the material layer 216 can be a dielectric material, a conductive material or an organic material. It is preferred that the material layer 216 is a photoresist layer.

Figure 2F:
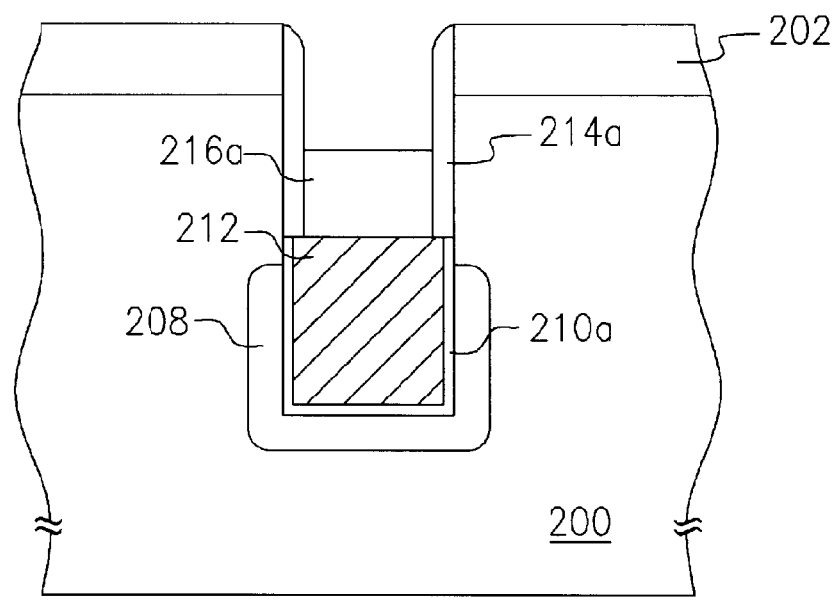

As shown in FIG. 2F, a portion of material layer 216 is removed, and a portion of the collar oxide layer 214a is exposed. In other words, remaining the material layer 216a in the deep trench exposes the portion of collar oxide layer 214a.

Figure 2G:
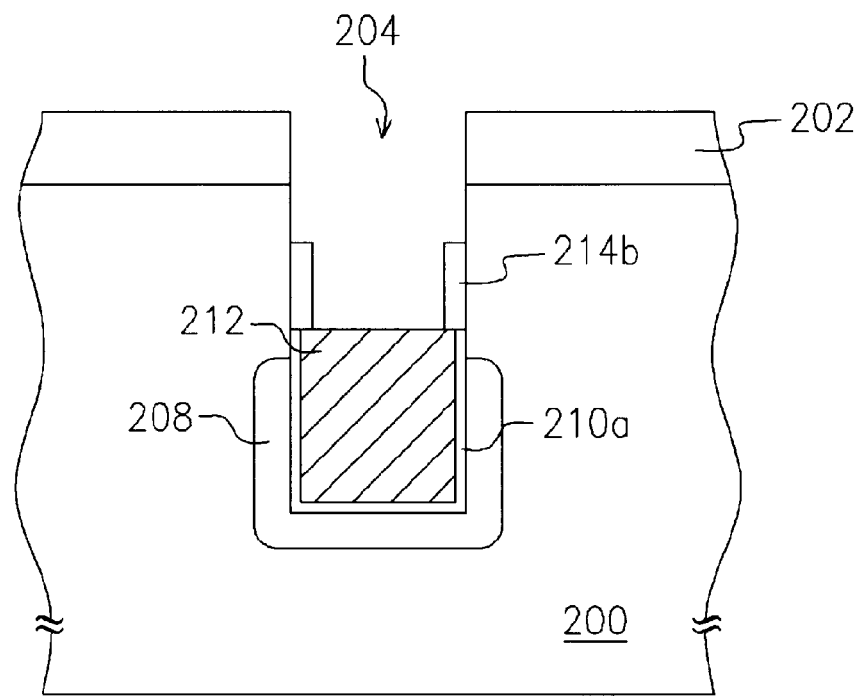

Then, the collar oxide layer 214a that is not covered by the material layer 216a is removed for forming the collar oxide layer 214b, wherein the substrate 200 at the sidewalls of the top of the deep trench 204 is exposed as shown in FIG. 2G. Then, the material 216a is removed and the first conductive layer 212 is exposed.

Figure 2H:
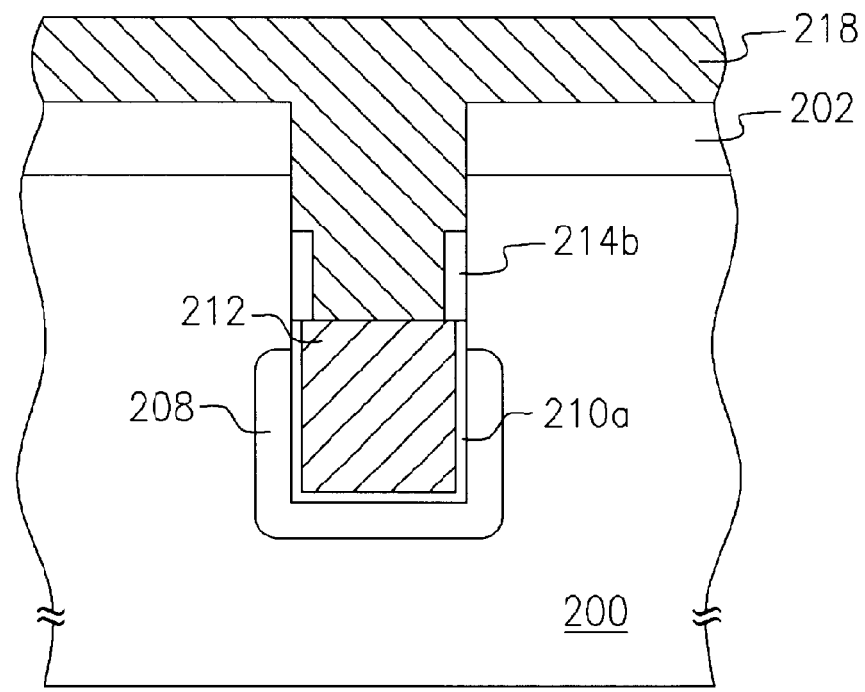
Figure 2I:
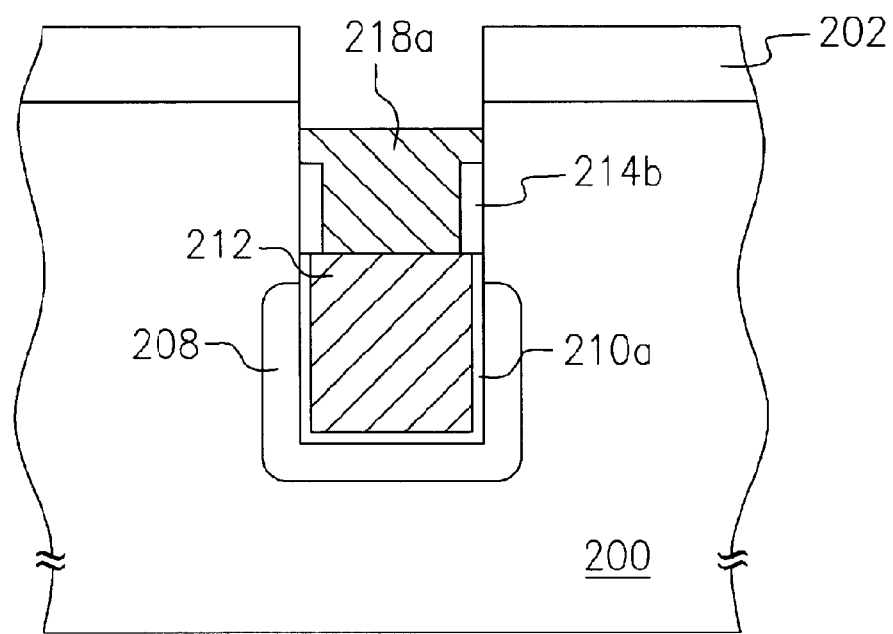

Please referring to FIG. 2H, a second conductive layer 218 is formed on the mask layer 202 and covers the first conductive layer 212 as well as the collar oxide layer 214b. In a preferred embodiment, the material of the second conductive layer is, for example, polysilicon. Then, a portion of the second conductive layer 218 is removed and the second conductive layer 218a remains in the deep trench as shown in FIG. 2I, wherein the second conductive layer 218a contacts the substrate 200 at the sidewalls of the top of the deep trench. In a preferred embodiment, the methods of removing the portion of the second conductive layer and remaining the second conductive layer 218a in the deep trench comprise, for example, performing a chemical mechanical polish process for removing the portion of the second conductive layer 218 until the mask layer 202 is exposed. Then, an etching process is performed for removing another portion of the second conductive layer 218 in the deep trench.

Then, the mask layer 202 is removed, and an active device (not shown), such as a transistor, is formed on the substrate 200. Therefore, the second conductive layer 218a electrically contacts the first conductive layer 212, and the second conductive layer 218a contacts the substrate 200 at the sidewalls of the top of the deep trench. Accordingly, the second conductive layer 218a electrically connects the electrode 212 of the capacitor to the active device.

Because the second conductive layer replaces the second and third conductive layers of the prior art, the issue of the dopant concentration of the second conductive layer being different from that of the third conductive layer which would otherwise adversely affect the threshold voltage of devices can be avoided.

In addition, the second conductive material is used as a component to electrically connecting the deep trench capacitor and the active device to resolve the problem of resistance at the interface of the second and third conductive layers.

Moreover, because the second conductive layer replaces the second and third conductive layers of the prior art, and therefore method of the present invention can simplify the process, in that a number of the polysilicon furnaces can be reduced.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A method for fabricating a deep trench capacitor, comprising:

providing a substrate, having a deep trench formed therein, a doped region formed at a bottom of the deep trench, a capacitor dielectric layer formed over a surface of the bottom of the deep trench, and a first conductive layer formed over the capacitor dielectric layer;

forming a collar oxide layer on sidewalls of the deep trench that are not covered by the first conductive layer;

forming a material layer within the deep trench, covering the first conductive layer, and exposing a portion of the collar oxide layer;

removing the exposed portion of the collar oxide layer for exposing the substrate at sidewalls of the top of the deep trench;

removing the material layer; and forming a second conductive layer, covering the first conductive layer and the collar oxide layer, the second conductive layer contacting the substrate at the sidewalls of the top of the deep trench.

2. The method for fabricating a deep trench capacitor of claim 1, wherein the removal rate of the material layer is different from that of the collar oxide layer.

3. The method for fabricating a deep trench capacitor of claim 1, wherein the material of the material layer is different from that of the first conductive layer.

4. The method for fabricating a deep trench capacitor of claim 1, wherein the material layer is a photoresist layer.

5. The method for fabricating a deep trench capacitor of claim 1, wherein the step of forming the collar oxide layer on the sidewalls of the deep trench that are not covered by the first conductive layer comprises:

forming an oxide layer over the substrate and the surface of deep trench; and etching back the oxide layer for forming the collar oxide layer on the sidewalls of the deep trench.

6. The method for fabricating a deep trench capacitor of claim 1, wherein the steps of forming the material layer, covering the first conductive layer, and exposing the portion of the collar oxide layer comprise:

forming the material layer over the substrate, filling the deep trench and covering the first conductive layer and the collar oxide layer; and removing a portion of the material layer for exposing the portion of the collar oxide layer.

7. The method for fabricating a deep trench capacitor of claim 6, wherein the step of removing the portion of the material layer for exposing the portion of the collar oxide layer comprises:

performing a chemical mechanical polish process for removing a portion of the material layer; and performing an etching process, removing another portion of the material layer for exposing the portion of the collar oxide layer.

8. The method for fabricating a deep trench capacitor of claim 1, wherein the step of removing the exposed portion of the collar oxide layer comprises a wet etching process.

9. The method for fabricating a deep trench capacitor of claim 1, wherein the material of the first conductive material comprises polysilicon.

10. The method for fabricating a deep trench capacitor of claim 1, wherein the material of the second conductive layer comprises polysilicon.

11. The method for fabricating a deep trench capacitor of claim 1, wherein the steps of forming the deep trench within the substrate, forming the doped region at the bottom of the deep trench, forming the capacitor dielectric layer over the surface of the bottom of the deep trench, and forming the first conductive layer over the capacitor dielectric layer comprise:

forming a mask layer on the substrate; patterning the substrate by using the mask layer as an etching mask for forming the deep trench within the substrate;

forming a doped layer on the mask layer and the surface of the deep trench;

removing a portion of the doped layer, and remaining the doped layer at the bottom of the trench;

performing a thermal process for diffusing ions within the doped layer into the substrate and forming the doped layer;

removing the doped region;

forming a dielectric layer over the mask layer and the surface of the deep trench;

filling the first conductive layer within the deep trench, but not completely filling the deep trench; and removing a portion of the dielectric layer and a remaining portion of the dielectric layer remain covered by the first conductive layer for forming the capacitor dielectric layer.

* * * * *